(12) United States Patent　　(10) Patent No.: US 11,085,949 B2
Audette et al.　　(45) Date of Patent: *Aug. 10, 2021

(54) PROBE CARD ASSEMBLY

(71) Applicant: INTERNATIONAL BUSINESS MACHINES CORPORATION, Armonk, NY (US)

(72) Inventors: David M. Audette, Colchester, VT (US); Dustin Fregeau, South Burlington, VT (US); David L. Gardell, Fairfax, VT (US); Peter W. Neff, Lamoille, VT (US); Frederick H. Roy, III, Williston, VT (US); Grant W. Wagner, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/656,637

(22) Filed: Oct. 18, 2019

(65) Prior Publication Data

US 2020/0049738 A1　　Feb. 13, 2020

Related U.S. Application Data

(63) Continuation of application No. 15/671,608, filed on Aug. 8, 2017, now Pat. No. 10,578,648, which is a (Continued)

(51) Int. Cl.
　　*G01R 1/073*　　(2006.01)
　　*G01R 31/28*　　(2006.01)

(52) U.S. Cl.
　　CPC ..... *G01R 1/07307* (2013.01); *G01R 1/07357* (2013.01); *G01R 31/2891* (2013.01)

(58) Field of Classification Search
　　CPC .. G01R 3/00; G01R 1/06727; G01R 1/07307; G01R 1/07357; G01R 31/2891; G01R 1/073; G01R 1/07378; E21B 43/013
　　USPC ...... 324/754.1, 500, 754.03, 754.01, 754.13, 324/754.14, 756.03, 756.04, 757.04, 324/757.05, 754.2
　　See application file for complete search history.

(56) References Cited

U.S. PATENT DOCUMENTS

| 4,772,846 A | 9/1988 | Reeds |
| 4,906,920 A | 3/1990 | Huff et al. |

(Continued)

OTHER PUBLICATIONS

List of IBM Patents or Patent Applications Treated as Related 1 page.

*Primary Examiner* — Melissa J Koval
*Assistant Examiner* — Trung Q Nguyen
(74) *Attorney, Agent, or Firm* — Erik Johnson; Andrew M. Calderon; Roberts Calderon Safran & Cole, P.C.

(57) ABSTRACT

A probe card assembly for nondestructive integrated circuit testing is disclosed. The probe card assembly includes an outer gimbal bearing with a tapered bearing surface being mounted on a top surface of a printed circuit board. The probe card assembly further includes an inner gimbal bearing with a spherical bearing surface which contacts the tapered bearing surface of the outer gimbal bearing at a single point of contact about a circumference thereof. The probe card assembly further includes a spring plate mounted to the outer gimbal bearing, providing a downward force to a substrate.

20 Claims, 7 Drawing Sheets

Related U.S. Application Data continuation of application No. 14/486,474, filed on Sep. 15, 2014, now Pat. No. 9,797,928.

(56) References Cited

U.S. PATENT DOCUMENTS

| | | |
|---|---|---|
| 4,918,383 A | 4/1990 | Huff et al. |
| 5,180,977 A | 1/1993 | Huff |
| 5,642,056 A | 6/1997 | Nakajima et al. |
| 5,804,983 A | 9/1998 | Nakajima et al. |
| 5,861,759 A | 1/1999 | Bialobrodski et al. |
| 5,974,662 A | 11/1999 | Eldridge et al. |
| 6,377,062 B1 | 4/2002 | Ramos et al. |
| 6,441,629 B1 | 8/2002 | Khoury et al. |
| 6,498,504 B2 | 12/2002 | Miyagi |
| 6,507,751 B2 | 1/2003 | Blume et al. |
| 6,600,334 B1 | 7/2003 | Hembree et al. |
| 6,624,648 B2 | 9/2003 | Eldridge et al. |
| 6,677,771 B2 | 1/2004 | Zhou et al. |
| 7,084,651 B2 | 8/2006 | Audette et al. |
| 7,622,935 B2 | 11/2009 | Hobbs et al. |
| 7,791,361 B2 | 9/2010 | Karklin et al. |
| 9,797,928 B2 | 10/2017 | Audette et al. |
| 2003/0038647 A1 | 2/2003 | Eldridge et al. |
| 2003/0080764 A1 | 5/2003 | Zhou et al. |
| 2005/0174132 A1* | 8/2005 | Chang ............... G01R 31/2889 324/750.25 |
| 2006/0022685 A1* | 2/2006 | Audette ............. G01R 31/2886 324/750.25 |
| 2017/0356933 A1 | 12/2017 | Audette et al. |

* cited by examiner

PROBE CARD ASSEMBLY

FIELD OF THE INVENTION

The invention relates to a self-planarizing probe card assembly and, more particularly, to a probe card assembly for nondestructive integrated circuit testing.

BACKGROUND

Wafer-level testing is a critical process to ensure that integrated circuits and semiconductor devices properly function. That is, wafer-level testing can be used to determine the characteristics or functionality of the integrated circuits and semiconductor devices. The integrated circuits and semiconductor devices that are being tested are typically referred to as device(s) under test (DUT).

Wafer-level testing is performed on a probe card assembly of a wafer prober. During integrated circuit wafer level test, individual integrated circuit chips. e.g., DUTs, are tested by temporarily contacting individual power and signal I/O connections, such as solder bumps, with probes mounted to a probe card assembly of a tester. However, as the number and density of I/Os increase it becomes increasingly difficult to ensure uniform and low resistance contact between the probes and each I/O connection. The probe card assembly plays a significant role in ensuring this contact.

SUMMARY

In an aspect of the invention, a probe card assembly comprises an outer gimbal bearing with a tapered bearing surface mounted on a top surface of a printed circuit board. The probe card assembly further comprises an inner gimbal bearing with a spherical bearing surface which contacts the tapered bearing surface of the outer gimbal bearing at a single point of contact about a circumference thereof. The probe card assembly further comprises a spring plate mounted to the outer gimbal bearing, providing a downward force to a substrate.

In an aspect of the invention, a probe card assembly comprises: an outer gimbal bearing mounted on a top surface of a printed circuit board; a compliant interposer positioned within an opening of the outer gimbal bearing and contacting the top surface of the printed circuit board; an inner gimbal bearing positioned within the opening of the outer gimbal bearing; a substrate positioned within an opening of the inner gimbal bearing and in electrical contact with the compliant interposer; and a spring plate mounted to the outer gimbal bearing which is configured to apply downward force directly on a surface of the inner gimbal bearing.

In an aspect of the invention, a probe card assembly comprises: an outer gimbal bearing mounted on a top surface of a printed circuit board and an opening with a first profile; a compliant interposer positioned within a lower portion of the opening of the outer gimbal bearing; an inner gimbal bearing positioned within an upper portion of the opening of the outer gimbal bearing with a second profile; a mechanism which prevents rotation of the inner gimbal bearing about a vertical axis; a substrate positioned within an opening of the inner gimbal bearing and in electrical contact with the compliant interposer; and a spring plate mounted to the outer gimbal bearing which is configured to provide a downward force on the inner gimbal bearing and the substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a self-planarizing probe card assembly and, more particularly, to a probe card assembly for nondestructive integrated circuit testing. More specifically, the probe card assembly of the present invention allows the substrate to tip so it becomes perfectly planar to the device being tested (DUT). In embodiments, the probe card assembly is configured and structured to interconnect an integrated circuit chip to a tester for nondestructive integrated circuit testing. The probe card assembly can be used with different probes, e.g., compliant probes, rigid probes, micromachined probes, vertical probes or membrane probes, mounted to the substrate. In embodiments, the probes should remain in the same location on the probe card so multiple DUTS on the wafer can be tested.

In embodiments, the probe card assembly includes a gimbal bearing assembly mounted on a top surface of a tester interface board. In this way, the gimbal bearing surfaces can include one spherical (inner) gimbal bearing and one flat, outer gimbal bearing. Advantageously, the configuration of the present invention eliminates sticking issues between inner and outer gimbal bearing assemblies, in addition to providing improved uniform probe contact force to all I/O signal and power connections for the device(s) under test (DUT). In addition, the probe card assembly design of the present invention eliminates the need for cabling and attaching the substrate to the assembly with epoxy, as well as enables the use of rigid probe systems, compared to compliant probes which are expensive and limited in ability to connect to closely spaced solder balls of future products. The present invention also provides a mechanism to fix the substrate to the inner gimbal bearing for repeatable positioning allowing for thermal expansion of dissimilar materials or temperature gradients.

Figure 1:
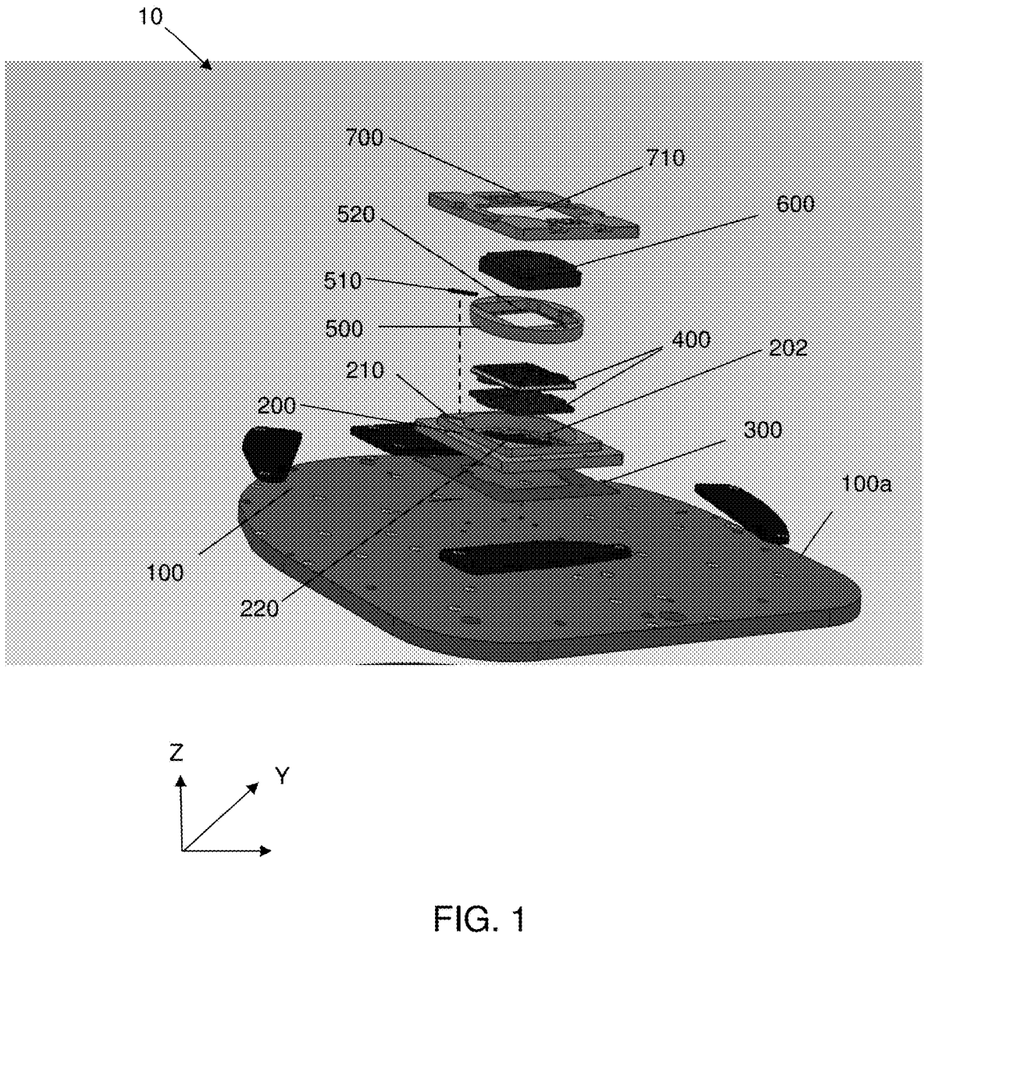
FIG. 1 shows an exploded view of a probe card assembly in accordance with aspects of the present invention.

FIG. 1 shows an exploded view of a probe card assembly in accordance with aspects of the present invention. More specifically, the probe card assembly 10 includes a printed circuit board 100, e.g., tester interface board, with an outer gimbal bearing 200 mounted on a top surface 100a. In embodiments, an optional shim 300 can be positioned between the outer gimbal bearing 200 and the printed circuit board 100. The shim 300 can have different thicknesses to accommodate various probe card assembly components as described herein (e.g., substrate, probes, etc.).

Figure 7:
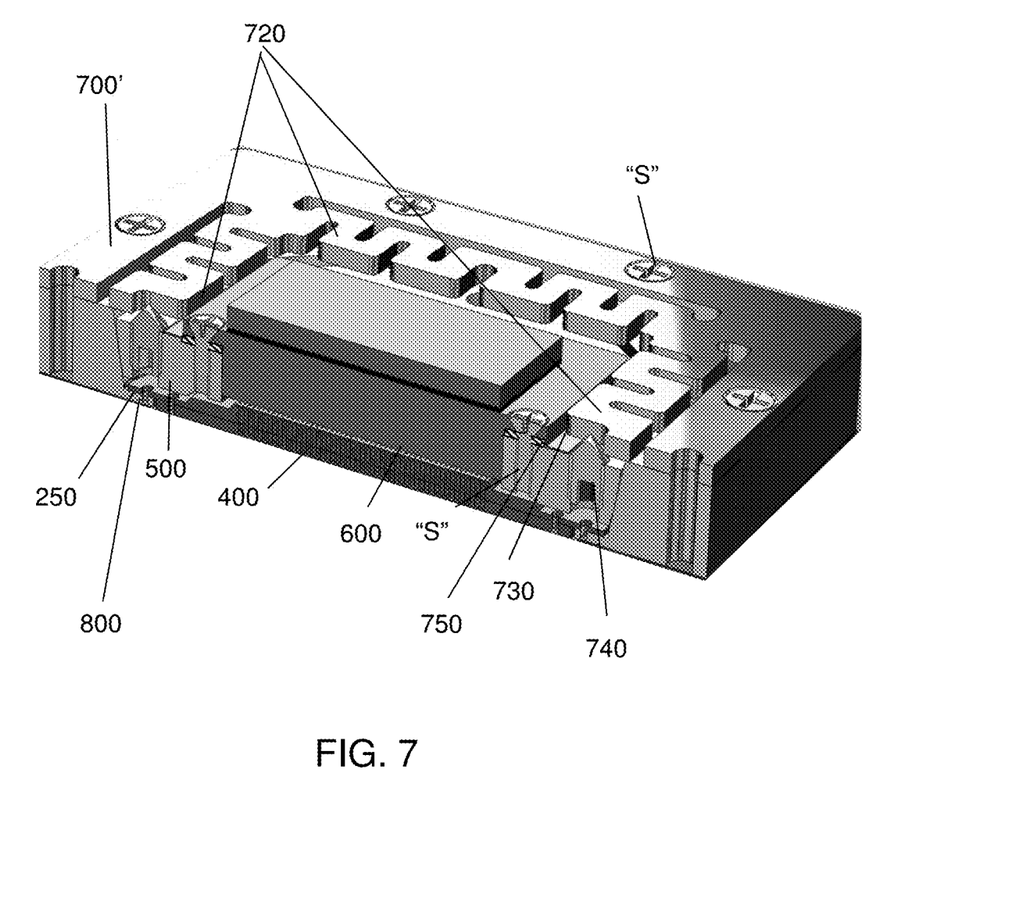
FIG. 7 shows a cross sectional view of the alternative spring plate, taken along line B-B of FIG. 6 in accordance with aspects of the present invention.

In embodiments, the outer gimbal bearing 200 includes an opening 220 structured to accommodate a compliant interposer assembly 400. The opening 220 of the outer gimbal bearing 200 will have a first profile (lower portion) that can constrain movement of the compliant interposer 400 in the X and Y directions. In embodiments, dowel pins can be used to secure the compliant interposer assembly 400 to the outer gimbal bearing 200 (as shown in FIG. 7.) In further embodiments, dowel pins can also be used to align and secure the outer gimbal bearing 200 to the printed circuit board 100. As further described herein, the interposer assembly 400 includes a plurality of pins (e.g., spring pins), which electrically connect the substrate 600 to the printed circuit board 100.

An inner gimbal bearing 500 is positioned within the opening 220 (with a second profile, different from the first profile) of the outer gimbal bearing 200. The second profile is a bearing surface which is provided at an upper portion of the opening 220. The inner gimbal bearing 500 can be provided above a ledge 202 of the outer gimbal bearing 200, formed by the first profile. In embodiments, the outer gimbal bearing 200 will substantially constrain movement of the inner gimbal bearing 500 in the X and Y directions, by way of the profile of the opening 220. In embodiments, the interposer assembly 400 should be positioned so as to not interfere with the movement of the inner gimbal bearing 500.

Figure 6:
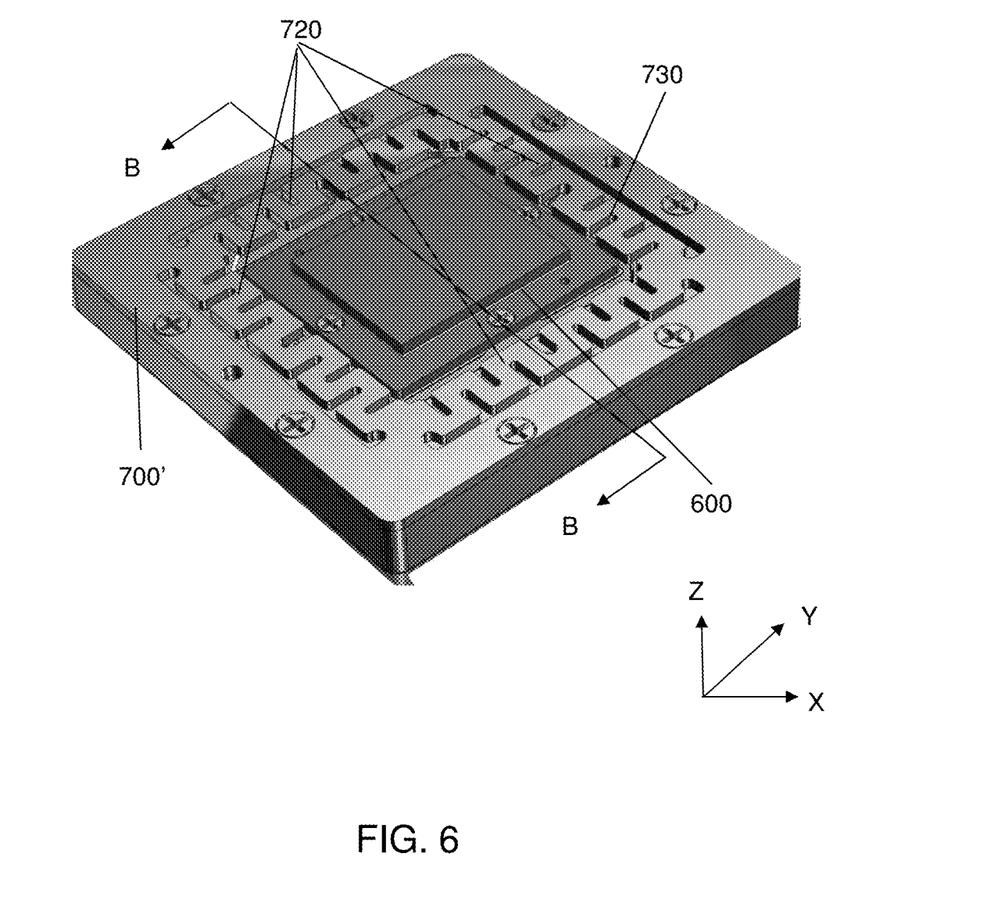
FIG. 6 shows a top down view of an alternative spring plate assembly in accordance with aspects of the present invention.

In embodiments, the inner gimbal bearing 500 can include a flexible tab 510 which engages the slot 210 of the outer gimbal bearing 200, thus preventing rotation about the vertical or Z axis. In further embodiments, the flexible tab 510 can be positioned in respectively aligned slots of the outer gimbal bearing 200 and the inner gimbal bearing 500. The flexible tab 510 can be steel spring or other flexible material, with a stiffness that allows vertical movement in the Z direction. As described further herein, the flexible tab 510 and slot 210 can be replaced with another mechanism to prevent rotation, as shown in FIGS. 6 and 7.

Still referring to FIG. 1, the substrate 600 is positioned within an opening 520 of the inner gimbal bearing 500. In embodiments, the substrate 600 can have a pedestal configuration (raised center portion) in order to ensure that it extends above a spring plate 700. The opening 520 has a substantially same profile as the substrate 600, which restrains movement or rotation of the substrate 600 with respect to the inner gimbal bearing 500. The opening 520 further permits the substrate 600 to contact the plurality of pins (e.g., spring pins) of the interposer 400, thus facilitating the connection of the substrate 600 to the printed circuit board 100. In this way, it is possible to have an electrical connection between the substrate 600 and the printed circuit board 100 via the pins of the compliant interposer 400. The substrate 600 may be ceramic or organic materials or a composite material.

The spring plate 700 is attached (mounted) to the outer gimbal bearing 200 surrounding the inner gimbal bearing 500. In embodiments, the spring plate 700 includes an opening 710 which exposes a surface of the substrate 600, e.g., raised area which will seat within the opening. In the configuration shown in FIG. 1, an underside of the spring plate 700 will provide a downward force directly on the substrate 600 and, in embodiments, the inner gimbal bearing 500. This downward force will compress the pins of the interposer 400 between the substrate 600 and the printed circuit board 100 thus ensuring a uniform and fully compliant connection therebetween, e.g., electrical connections of the substrate fully contacting the respective pins of the interposer 400. Compliance of the interposer 400 allows the substrate 600 to tilt; that is, as the inner gimbal bearing 500 tilts, the compression of the interposer 400 as applied by the substrate 600 will increase on one side and decrease on another side.

Also, the spring plate 700, which is connected to the outer gimbal bearing 200, will urge the inner gimbal bearing 500 into contact with the outer gimbal bearing 200 while allowing the substrate 600 and thus the probes that are attached to it to dynamically maintain planarity to the device being tested (DUT). The initial difference in planarity between the probes and the DUT should be less than the acceptable range of compression of the interposer. In embodiments, the spring plate 700 can be an assembly of different parts, including a frame and a stainless steel, hardened steel or other appropriate spring type material.

Figure 2:
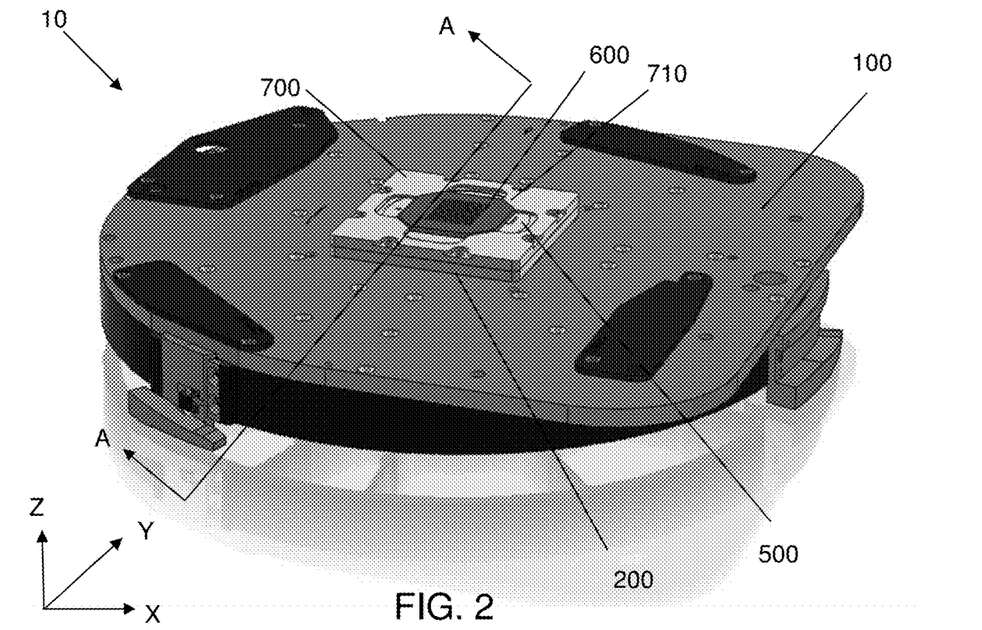
FIG. 2 shows the probe card assembly in a partially assembled state in accordance with aspects of the present invention.

FIG. 2 shows the probe card assembly 10 in a partially assembled state in accordance with aspects of the present invention. More specifically, FIG. 2 shows the outer gimbal bearing 200 and inner gimbal bearing 500 mounted on the top surface of the printed circuit board 100. The substrate 600 is held within the inner gimbal bearing 500 and, in embodiments, within the spring plate 700. The spring plate 700 is mounted to the outer gimbal bearing 200, thereby holds the assembly together.

As previously described, the spring plate 700 will provide a downward force onto the substrate 600 and the inner gimbal bearing 500. This downward force will compress the pins of interposer between the substrate 600 and the printed circuit board 100 ensuring a uniform and fully compliant connection therebetween. Also, the spring plate 700 and its connection to the outer gimbal bearing 200 will provide ample space to allow each side (e.g., right side and left side) of the inner gimbal bearing 500 to tilt from side-to-side in the vertical direction. This floating feature ensures that the substrate 600 is fully compliant (e.g., in contact) with the pins of the interposer (not shown).

As further shown in FIG. 2, the spring plate includes an opening 710 which restrains the substrate 600 from any rotational movement, e.g., about the Z axis. That is, in embodiments, the opening 710 has a profile which will mate or contact with flat corners of the substrate 600; although other configurations are also contemplated by the present invention. For example, the opening 710 can have straight sides which contact the straight sides of the substrate 600. In any such configuration, though, the spring plate 700 (and the opening of the inner gimbal bearing) will prevent certain movements, e.g., a rotation about the Z axis, of the substrate 600.

Figure 3:
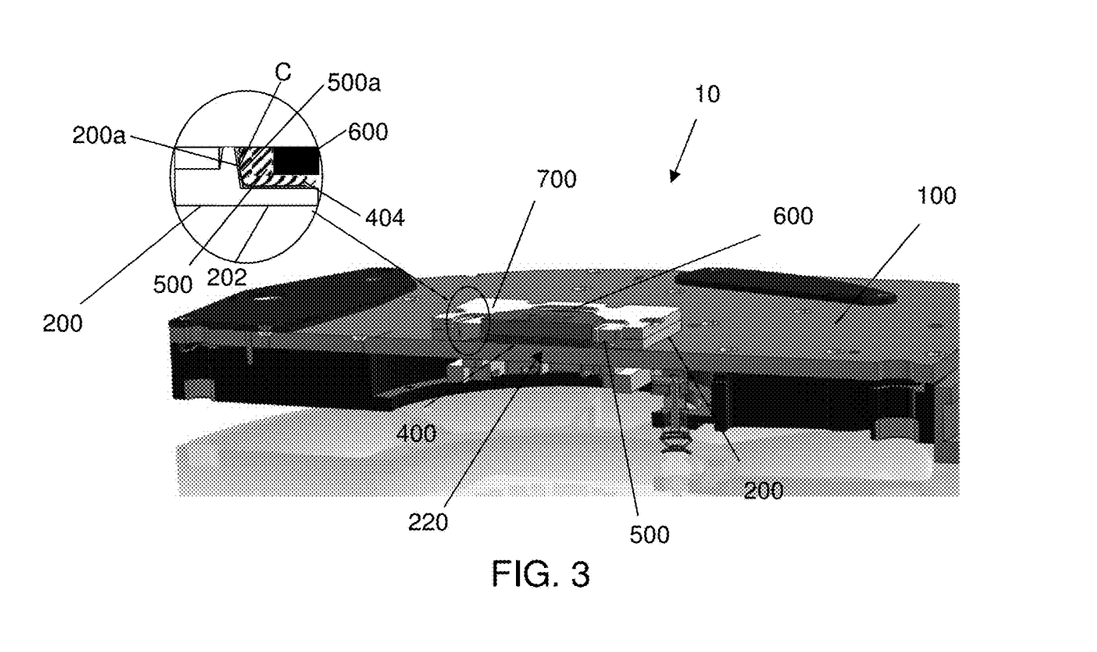
FIG. 3 is a cross-sectional view of the probe card assembly along line A-A of FIG. 2 in accordance with aspects of the present invention.

FIG. 3 is a cross-sectional view of the probe card assembly 10 along line A-A of FIG. 2. In this view, the interposer 400 is shown to be provided within the opening 220 of the outer gimbal bearing 200. The interposer 400 is also provided between the substrate 600 and the printed circuit board 100, with a downward force being applied by the spring plate 700. The inner gimbal bearing 500 is mounted within the opening 220 of the outer gimbal bearing 200.

In one contemplated embodiment, the bearing surfaces of the inner gimbal bearing 500 and the outer gimbal bearing 200 can have a same profile, e.g., spherical. Also, in embodiments, the inner gimbal bearing 500 can rotate about a center point which is at the tip of the probe and the center or substantially the center of the substrate 600. In other words, the geometric center of the spherical bearing's surface is near the center of the probe array. This allows the substrate 600 to tip about the X and Y axes, without causing any misalignment in the X and Y directions. In other embodiments, the center of the spherical surface may be slightly above or below the tips of the probes causing the probe to scrub on the solder balls or pads of the substrate as the substrate tilts.

In alternative embodiments as shown in the exploded view of FIG. 3, the inner edge surface (bearing surface) 200a of opening 220 of the outer gimbal bearing 200 and the outer edge surface (bearing surface) 500a of the inner gimbal bearing 500 have different profiles. For example, the inner edge surface 200a of opening 220 of the outer gimbal bearing 200 has a conical or tapered profile; whereas, the outer edge surface 500a of the inner gimbal bearing 500 has a spherical profile. In this way, the inner edge surface 200a of opening 220 of the outer gimbal bearing 200 is tangent to the outer edge surface 500a of the inner gimbal bearing 500. By using such a configuration, there is a single point of contact "C" between the two edges or surfaces, which will minimize any frictional forces between the surfaces 200a and 500a and reduce any sticking between the outer gimbal bearing 200 and the inner gimbal bearing 500. Also, the inner gimbal bearing 500 can be provided above the ledge 202 of the outer gimbal bearing 200, formed by the first profile. The substrate 600 also rests on a ledge 404 of the inner gimbal bearing 500 to control the height of the substrate and support vertical forces.

In embodiments, the outer gimbal bearing 200 can also have a coating or lubrication, e.g., Polytetrafluoroethylene (PTFE) which has a brand name of Teflon® (Teflon is a registered trademark of DuPont Co.). The coating can reduce friction between the outer gimbal bearing 200 and the inner gimbal bearing 500, and hence assist in preventing sticking issues.

Figure 4:
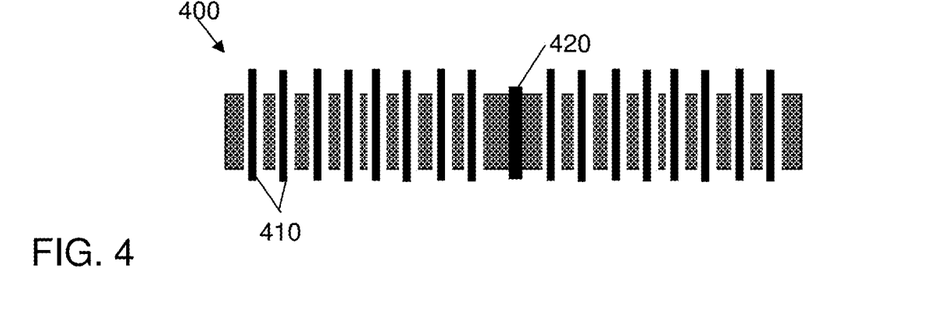
FIG. 4 shows a cut-away view of a compliant interposer in accordance with aspects of the present invention.

FIG. 4 shows a cut-away view of a compliant interposer 400 in accordance with aspects of the present invention. As shown in this view, the compliant interposer 400 includes a plurality of pins 410 which can float in respective openings of the compliant interposer 400. In embodiments, the plurality of pins 410 can be spring or pogo pins, as an example, made from a conductive material, e.g., copper, nickel or gold plated material. Other types of interposers are also contemplated by the present invention with different configurations and pins such as, for example, interposers with conductive polymer bumps, isotropic conductive sheets, etc.

Also, a center support post (rigid or compliant post) 420 can be provided at the center of the compliant interposer 400. In this way, the center of the substrate can rest on the center support post 420, facilitating the tilting motion. The center support post 420 should be of such a height from the surface as to not interfere with any of the connections between the plurality of pins 410 and the substrate. That is, in embodiments, the center support post 420 should equal the height of the pins 410 when the pins are in a compressed state. The compliant interposer 400 is preferably made from a rigid material (e.g., plastic) or assembly thereof.

In embodiments, the center support post 420 supports the substrate 600 in the vertical direction, while allowing the substrate 600 to gimbal. In embodiments, the center support post 420 will provide additional support at the center of the substrate 600 and reduce the tendency of concave bowing. In one embodiment, the bearing surface of the outer bearing is vertical, providing alignment in the XY direction. In this case, all downward force from the probes and spring will be supported by the interposer and center support post 420.

Figure 5:
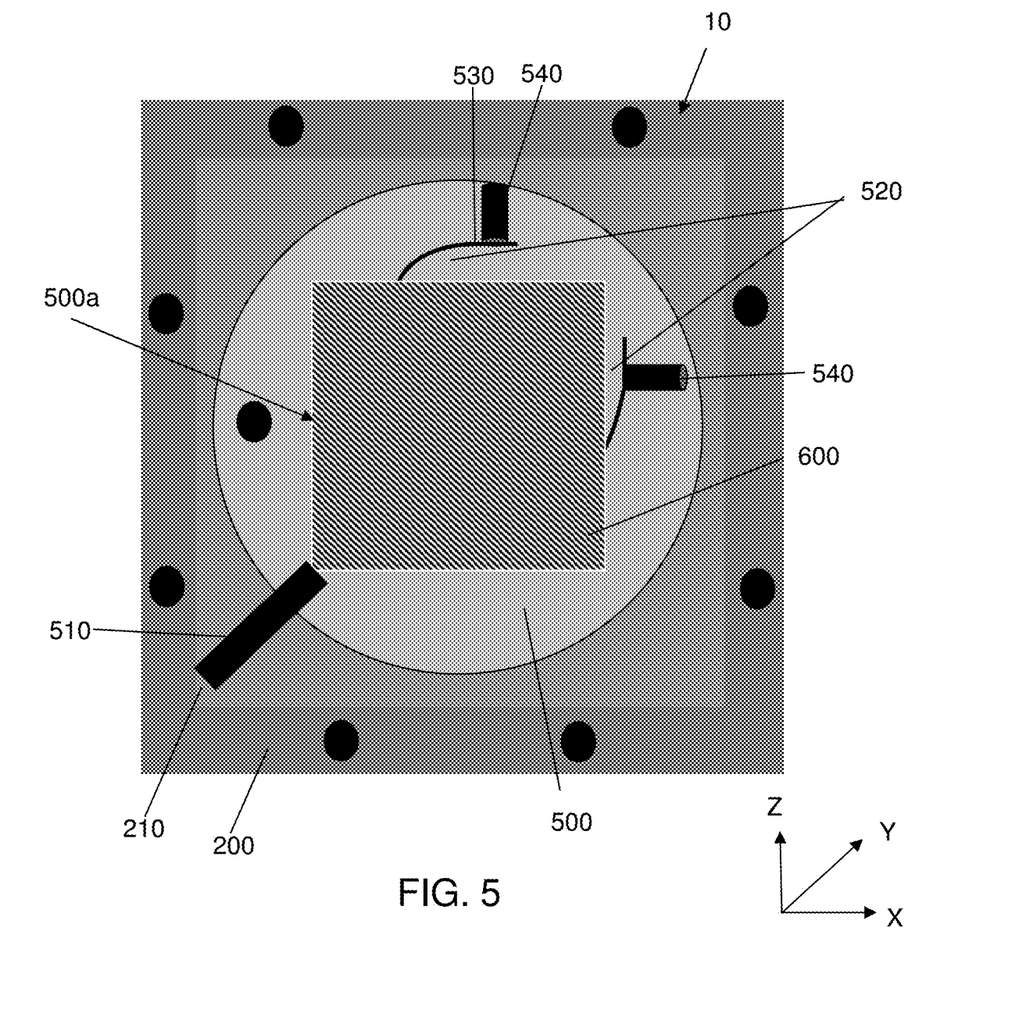
FIG. 5 shows a partial top down view of the probe card assembly in accordance with aspects of the present invention.

FIG. 5 shows a partial top down view of the probe card assembly 10 in accordance with aspects of the present invention. As shown illustratively in this view, the inner gimbal bearing 500 includes a spring feature 520. Advantageously, the spring feature 520 can compensate for misalignment of the substrate 600 due to tolerances and/or thermal coefficient of expansion (CTE) mismatch between the components of the probe card assembly 10, e.g., outer gimbal bearing 200, inner gimbal bearing 500 and substrate 600. In this way, the spring feature 520 can adjust the position of the substrate 600 into proper alignment with the interposer, for example. Also, the spring feature 520 will ensure that the substrate 600 remains in position during testing of all DUTs on the wafer.

In embodiments, the spring feature 520 can be composed of a portion of the frame of the inner gimbal bearing 500, as defined by a slot 530 and a set screw 540. As should be understood by those of skill in the art, the spring feature 520 can be used to position the substrate 600 within the opening 500a of the inner gimbal bearing 500, in the X and Y direction (e.g., towards the opposite sides of the opening). In embodiments, the set screw 540 can be used to adjust the pressure imposed by the spring feature 520 on the substrate 600. FIG. 5 also shows the flexible tab 510 keyed into the slot 210 of the outer gimbal bearing 200. In this way, the inner gimbal bearing 500 and substrate 600, which is held in the inner gimbal bearing 500, will be prevented from any rotation about the vertical axis (Z axis).

FIGS. 6 and 7 show an alternative spring plate in accordance with aspects of the present invention. More specifically, FIG. 6 is a top down view of the alternative spring plate 700'; whereas, FIG. 7 is a cross sectional view of the alternative spring plate 700', taken along line B-B of FIG. 6.

As shown in FIG. 6, for example, the spring plate 700' includes a slotted configuration 720. In embodiments, the slotted configuration can be of different patterns. For example, the pattern can be a serpentine configuration. The different patterns (e.g., serpentine configuration) 720 can flex or move in multi-directions, thus compensating for tolerances in the X-Y directions and allowing movement in the Z direction for compliance and tilting of the underlying substrate 600. In embodiments, the spring plate 700' will be mounted directly to the outer gimbal bearing 200, with the serpentine configuration 720 over the inner gimbal bearing 500. This configuration provides the requisite downward force on the substrate 600 (by virtue of its mounting to the inner gimbal bearing 500) so that it can be fully compliant with the connections (pins) of the interposer 400.

As further shown in FIGS. 6 and 7, the substrate 600 can be mounted to the inner gimbal bearing 500, e.g., by one or more screws "S". This will ensure that the substrate 600 stays fully constrained within the inner gimbal bearing 500, and hence will move in unison with the movement of the inner gimbal bearing 500. In this configuration, the substrate 600 is an organic substrate. As further shown in FIGS. 6 and 7, the spring plate 700' is mounted to the outer gimbal bearing 200, e.g., by one or more screws "S", with the serpentine configuration 720 provided over the circumference of the inner gimbal bearing 500. This configuration provides the necessary downward force.

As shown in FIG. 7, a dowel 800 is used to secure and align the interposer assembly 400 to the outer gimbal bearing assembly 200. A shim 750 can also be placed between the inner gimbal bearing 500 and the substrate 600 to reduce stress on the assembly. The shim 750 or adjustment features such as screws can be installed at various locations in the assembly to adjust for manufacturing tolerances and assure there is sufficient force on the interposer for reliable electrical contact at the same time the inner and outer bearing are in intimate contact. Examples would be between the spring and substrate, between the spring and outer bearing and between the outer bearing and board.

Dowel pins are commonly used to align different components of probe card assemblies. For delicate parts that must be assembled by hand the dowel pins need to be made smaller than the hole by some tolerance. If more than one pin is used the tolerance must be increased to allow for machining errors in the hole locations. Sometimes one hole is intentionally elongated to allow slightly tighter tolerances. The tolerances tend to increase over time due to wear of the holes and pins during assembly and use. The dowel pins 800 of FIG. 7 provide acceptable accuracy for aligning the pogo pins of the interposer 400 to the relatively large pads on the substrate 600 via the outer bearing 200.

As the DUT solder ball size and spacing continue to decrease, an improved method of alignment is needed to hold the probes in alignment with the solder balls after testing multiple chips on a wafer. As shown in FIG. 7, a set screw or other raised feature of the inner bearing represented at reference numeral 740 engages the slots 730 of the serpentine configuration 720 thereby preventing rotation about the Z axis (thus eliminating the need for the flexible tab configuration), while still allowing a tilting movement of the inner gimbal bearing 500 and substrate 600. In embodiments, the set screw 740 can have a wedge shape, a conical shape, spherical shape or other shape that would engage with the slots 730. The spring forces the screw tip into the slot thus assuring perfect repeatable alignment regardless of small variations in the shape or locations of the screw or slot due to initial fabrication or wear of the parts.

In embodiments, a wedge shape of the set screw which engages the slots 730 will prevent the screw from rotation and hence disengaging from the slots. Also, the wedge shape would provide a line contact into the slots 730 thus making it more durable. In any of these configurations, the flexible tab configuration shown in FIGS. 1 and 5 can be eliminated. In embodiments, the set screw 740 can be placed on any combination of sides of the serpentine configuration 720 to engage with the slots 730. As further shown in FIG. 7, the set screw 740 can be part of an assembly of the inner gimbal bearing 500. The set screw 740 engaging the serpentine configuration 720 can also be used to adjust the initial planarity of the substrate 600.

In alternate embodiments, the set screw 740 can be a raised area of the inner gimbal bearing 500 or the spring plate 700', where the slots 730 can be a depressed area in the other of the gimbal bearing 500 or the spring plate 700' such that the raised area contacts with a portion of the depressed area by the spring force in order to prevent rotation about the Z axis. In embodiments, the raised and/or depressed areas have a tapered or curved shape.

Other configurations will now be obvious, for example, a conical shape pin forced into a hole will restrain one more degree of freedom. A cylindrical post can be forced into a tapered hole or slot. The hole or slot can be formed on the inner bearing or substrate with the conical surface formed on the spring. Springs can be configured to have different stiffness in different directions, for example a simple cantilever flat sheet metal spring will have little stiffness in the direction of the thickness but high stiffness in the direction of its length and width. Springs can be strait or curved and fixed at one end or both ends. The preferred spring plate 700' is a serpentine pattern fixed at both ends.

In embodiments, the vertical forces in the assembly need to be balanced. In one example, for a very large chip, the probe force may be 400 pounds (lbs.), with the interposer force being only 75 lbs. at its recommended compression. In this case, the spring force may be designed to be 100 lbs. to insure good contact between the inner gimbal bearing 500 and the outer gimbal bearing 200 when the probes are being aligned to the DUT. During probing, the resulting force of 400 lbs.+100 lbs.-75 lbs.=425 lbs. is supported by the bearing surface of the inner gimbal bearing 500, e.g., spherical bearing surface. The bearing geometry, bearing surfaces and substrate all need to be designed to support this load without excessive deflection.

Also, during probing the perimeter support of the substrate by the inner gimbal bearing 500 will result in a tendency of the substrate 600 to become bowed creating a concave surface on the substrate resulting in heavier probe marks around the perimeter. In one embodiment, the substrate 600 is connected to the inner gimbal bearing 500 by screws "S" on the center of each side. Supporting the substrate 600 at only the sides and not the corners results in reduced bowing of the substrate 600. This can be accomplished with a shim 750 that is in the area of the screws or raised areas on the substrate or bearing. When the probe is being aligned the force from the interposer will tend to cause the substrate to bow slightly creating a convex surface.

Figure 8A:
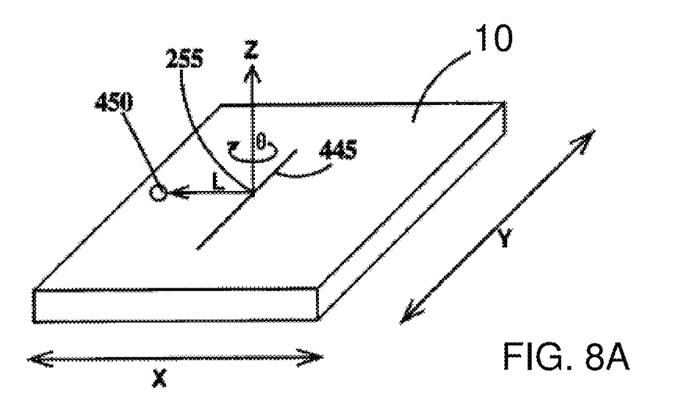
FIGS. 8A and 8B illustrate the degrees of freedom of a probe card assembly according to the present invention.
Figure 8B:
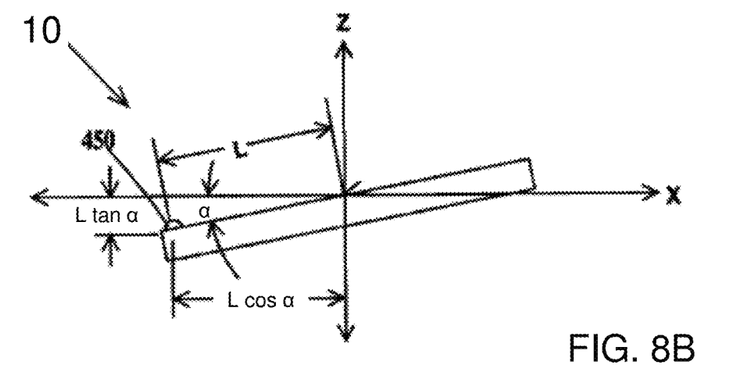

FIGS. 8A and 8B illustrate the degrees of freedom of a probe assembly according to aspects of the present invention. FIG. 8A is an isometric view and FIG. 8B is a side view of the substrate 600 in accordance with aspects of the present invention. In FIG. 8A, vertical axis defines the Z-direction, with the X and Y directions being orthogonal to each other and to the Z direction. The θ direction is defined as rotation about the Z direction. L is a vector to an arbitrary probe tip 450 protruding above surface of the substrate 600. In FIG. 8B, the surface of the substrate 600 has been tilted through an angle α through an arbitrary axis 445 (see FIG. 8A). By making such a tilting movement, it is possible to ensure full compliance and contact of the probe to the solder ball on the DUT.

Figure 9:
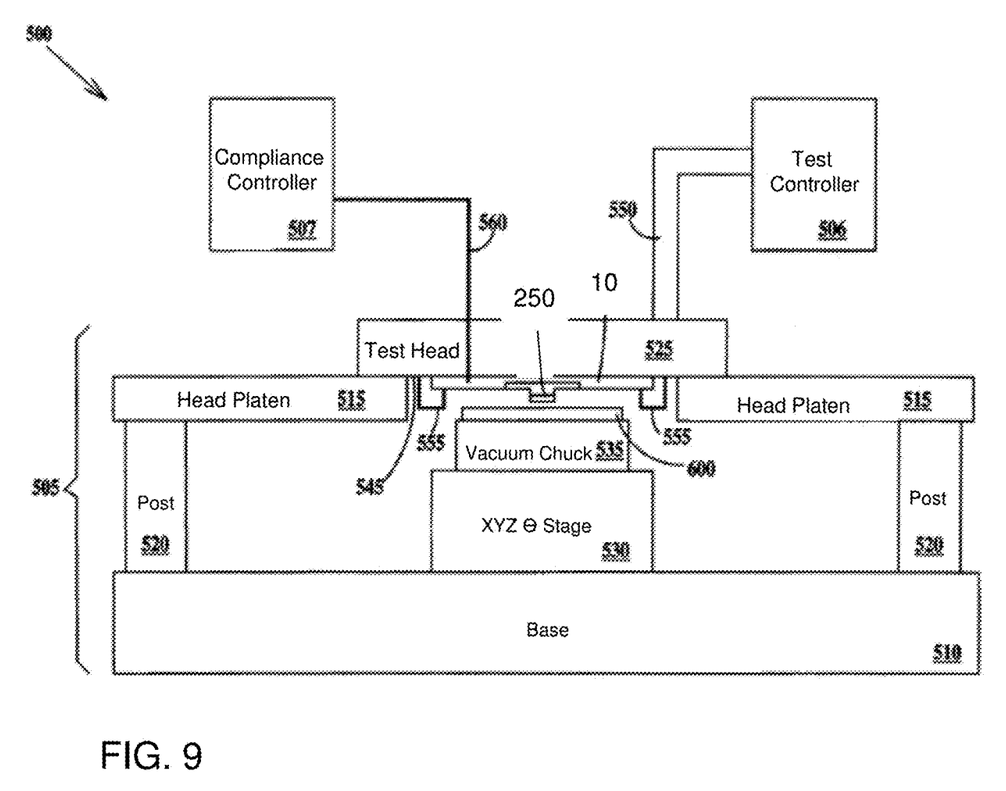
FIG. 9 is a side view diagram of a tester that may be used with the probe card assembly of the present invention.

FIG. 9 is a side view diagram of a tester that may be used with the probe card assembly 10 of the present invention. As one of skill in the art should realize, the probe card 10 is mounted upside down from the previous figures. In FIG. 9, a tester 500 includes a test fixture 505, a test controller 506 and an optional compliance controller 507. Test fixture 505 includes a base 510 and a head platen 515 connected to base 510 by posts 520. Test fixture 505 further includes a test head 525, an XYZΘ stage 530 and a vacuum chuck 535 (e.g., a clamp mechanism may be substituted) for clamping an integrated circuit wafer 600 having a multiplicity of integrated circuit chips, in place. XYZΘ stage 530 is mounted to base 510 and vacuum chuck 535 is mounted to XYZΘ stage 530. Test head 525 is mounted to a top surface 540 of head platen 515. A probe card assembly 10 is mounted to a bottom surface 545 of test head 525. Mounted on probe card assembly 10 is probe assembly 250. Bottom surface 545 is also the datum of test fixture 505. A multiple electrical conductor cable 550 connects test head 525 to test controller 506. Alternatively, the connection can be made with pogo pins, also represented by reference numeral 550.

Multiple electrical conductor cables 555 connect probe card assembly 10 to test head 525. An optional tube 560 connects optional compliance controller 507 to probe card assembly 10 in the event that the probe card assembly utilizes a compliance mechanism requiring a pressurizing fluid. In operation, XYZO stage 530 moves integrated circuit chip on wafer 600 under and aligned to probe assembly 10 and then raises the wafer so solder bumps on the integrated circuit chip contact the probe tips of the probe assembly. The Z-direction travel defines the first order compliance of the tester.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A probe card assembly, comprising:
   an outer gimbal bearing with a bearing surface mountable on a top surface of a printed circuit board;
   an inner gimbal bearing with a bearing surface which contacts the bearing surface of the outer gimbal bearing at a single point of contact about a circumference thereof; and
   wherein the bearing surface of the inner gimbal bearing and the bearing surface of the outer gimbal bearing have a different profile.

2. The probe card assembly of claim 1, wherein the bearing surface of the outer gimbal bearing is tangential to the bearing surface of the inner gimbal bearing.

3. The probe card assembly of claim 1, further comprising a mechanism which prevents rotation of the inner gimbal bearing about a vertical axis with respect to the outer gimbal bearing.

4. The probe card assembly of claim 3, further comprising a spring plate mounted to the outer gimbal bearing, providing a downward force to a substrate.

5. The probe card assembly of claim 4, wherein the mechanism comprises a depressed area provided on one of the spring plate and the inner gimbal bearing which engages with a raised area of another of the spring plate and the inner gimbal bearing to prevent rotation of the substrate about a Z-axis.

6. The probe card assembly of claim 4, wherein the mechanism includes a flexible tab extending between the inner gimbal bearing and the outer gimbal bearing.

7. The probe card assembly of claim 4, wherein the mechanism includes slots provided on the spring plate engaging with at least one set screw provided as an assembly with the inner gimbal bearing.

8. The probe card assembly of claim 7, wherein the at least one set screw has a wedge shape which engages with a slotted pattern of the spring plate.

9. The probe card assembly of claim 8, wherein the slotted pattern is a serpentine configuration, which flexes when the substrate tilts and restraining a rotation about a Z axis of the substrate.

10. The probe card assembly of claim 1, wherein the inner gimbal bearing includes a spring mechanism to adjust a positioning of the substrate within the opening of the inner gimbal bearing.

11. The probe assembly of claim 1, further comprising a shim provided between the substrate and the inner gimbal bearing to reduce stresses in the substrate.

12. A probe card assembly, comprising:
   an outer gimbal bearing mountable on a top surface of a printed circuit board;
   a compliant interposer positioned within an opening of the outer gimbal bearing and contactable to the top surface of the printed circuit board;
   an inner gimbal bearing positioned within the opening of the outer gimbal bearing; and
   a substrate positioned within an opening of the inner gimbal bearing and in electrical contact with the compliant interposer,
   wherein an outer edge surface of the inner gimbal bearing and an inner edge surface of the outer gimbal bearing have a different profile such that the outer edge surface is tangential to the inner edge surface.

13. The probe card assembly of claim 12, wherein the inner gimbal bearing includes a spring mechanism to adjust a positioning of the substrate.

14. The probe card assembly of claim 13, further comprising a shim provided between the substrate and the inner gimbal bearing to reduce stresses in the substrate.

15. The probe card assembly of claim 12, wherein the inner gimbal bearing includes a spring mechanism to adjust a positioning of the substrate within the opening of the inner gimbal bearing.

16. The probe card assembly of claim 12, wherein the compliant interposer includes a center post which is structured and positioned to facilitate a tilting motion of the substrate.

17. A probe card assembly, comprising:
   an outer gimbal bearing mounted on a top surface of a printed circuit board and having an opening with a first profile;
   a compliant interposer positioned within a lower portion of the opening of the outer gimbal bearing;
   an inner gimbal bearing positioned within an upper portion of the opening of the outer gimbal bearing having a second profile;
   a mechanism which prevents rotation of the inner gimbal bearing about a vertical axis; and
   a substrate positioned within an opening of the inner gimbal bearing and in electrical contact with the compliant interposer.

18. The probe card assembly of claim 17, wherein a bearing surface of the inner gimbal bearing and bearing surface of the outer gimbal bearing have a different circumferential profile such that the bearing surface of the outer gimbal bearing is tangential to the bearing surface of the inner gimbal bearing.

19. The probe card assembly of claim 17, further comprising a spring plate mounted to the outer gimbal bearing which is configured to provide a downward force on the inner gimbal bearing and the substrate.

20. The probe card assembly of claim 17, wherein:
- the mechanism includes serpentine slots provided on the spring plate engaging with at least one set screw provided as an assembly with the inner gimbal bearing;
- the serpentine slots of the spring plate are provided above a circumference of the inner gimbal bearing; and
- the spring plate provides a downward force on the substrate by contacting the inner gimbal bearing such that electrical connections of the substrate are fully compliant with pins of the interposer.

* * * * *